(12) United States Patent
Gill

(10) Patent No.: US 6,961,225 B2
(45) Date of Patent: Nov. 1, 2005

(54) MAGNETORESISTANCE SENSOR HAVING AN ANTIFERROMAGNETIC PINNING LAYER WITH BOTH SURFACES PINNING FERROMAGNETIC BIAS LAYERS

(75) Inventor: Hardayal Singh Gill, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 10/081,046

(22) Filed: Feb. 20, 2002

(65) Prior Publication Data

US 2003/0156362 A1 Aug. 21, 2003

(51) Int. Cl.[7] .............................................. G11B 5/39
(52) U.S. Cl. ........................ 360/324.12; 360/327.3; 360/324.11
(58) Field of Search ................ 360/324.11, 324.12, 360/327.3, 327.32, 324.1, 324.2; 428/611

(56) References Cited

U.S. PATENT DOCUMENTS

| | | | | |
|---|---|---|---|---|
| 5,436,778 | A | * 7/1995 | Lin et al. | 360/327.32 |
| 5,729,410 | A | * 3/1998 | Fontana et al. | 360/324.2 |
| 5,729,411 | A | 3/1998 | Kishi et al. | 360/113 |
| 5,739,987 | A | 4/1998 | Yuan et al. | 360/113 |
| 5,768,067 | A | 6/1998 | Saito et al. | 360/113 |
| 5,949,623 | A | 9/1999 | Lin | 360/113 |
| 6,040,961 | A | * 3/2000 | Gill | 360/324.11 |
| 6,052,263 | A | * 4/2000 | Gill | 360/324.11 |
| 6,074,767 | A | 6/2000 | Lin | 428/692 |
| 6,108,177 | A | * 8/2000 | Gill | 360/324.12 |
| 6,185,078 | B1 | * 2/2001 | Lin et al. | 360/324.12 |
| 6,204,071 | B1 | 3/2001 | Ju et al. | 438/3 |
| 6,222,707 | B1 | * 4/2001 | Huai et al. | 360/324.1 |
| 6,266,218 | B1 | * 7/2001 | Carey et al. | 360/324.12 |
| 6,313,973 | B1 | * 11/2001 | Fuke et al. | 360/324.1 |
| 6,496,338 | B2 | * 12/2002 | Hasegawa et al. | 360/324.12 |
| 6,542,341 | B1 | * 4/2003 | Carey et al. | 360/324 |
| 6,567,247 | B1 | * 5/2003 | Araki et al. | 360/324.12 |
| 6,893,734 | B2 | * 5/2005 | Hasegawa et al. | 360/324.12 |

FOREIGN PATENT DOCUMENTS

| | | | |
|---|---|---|---|
| JP | 06-103536 | 4/1994 | G11B/5/39 |
| JP | 11134619 | 5/1999 | G11B/5/39 |
| JP | 11307839 | 11/1999 | H01L/43/08 |
| JP | 2000-228003 | 8/2000 | G11B/5/39 |

OTHER PUBLICATIONS

"Continuous Spacer Spin Valve Structure," IBM Technical Bulletin, vol. 39 No. 4, pp. 147–149 (Apr. 1996).

"Spin Valve/Giant Magneto Resistive Sensor Magnetic Stabilization", IBM Technical Bulletin, vol. 39 No. 10, pp. 123–124 (Oct. 1996).

* cited by examiner

Primary Examiner—William Korzuch
Assistant Examiner—Christopher R. Magee
(74) Attorney, Agent, or Firm—Gregory Garmong; William D. Gill

(57) ABSTRACT

A magnetoresistance sensor structure includes a magnetoresistance sensor having a sensor surface plane and having a free layer. An upper antiferromagnetic layer overlies at least a portion of the free layer, and an upper ferromagnetic layer overlies and contacts at least a portion of the upper antiferromagnetic layer on a contact face lying parallel to the sensor surface plane, so that the upper antiferromagnetic layer lies between the upper ferromagnetic layer and the free layer. The magnetoresistance sensor may be a giant magnetoresistance sensor or a tunnel magnetoresistance sensor.

23 Claims, 3 Drawing Sheets

MAGNETORESISTANCE SENSOR HAVING AN ANTIFERROMAGNETIC PINNING LAYER WITH BOTH SURFACES PINNING FERROMAGNETIC BIAS LAYERS

This invention relates to a structure of a magnetoresistance (MR) sensor and, more particularly, to such a sensor having an antiferromagnetic layer above the free layer.

BACKGROUND OF THE INVENTION

A magnetoresistance (MR) sensor is used in a read/write head to read magnetic fields on a recording medium of a magnetic storage device. An example is the read/write head of a computer hard disk or a magnetic recording tape drive. The read/write head is positioned closely adjacent to the recording medium, separated from the recording medium by an air bearing surface (ABS) that does not allow them to touch. A data bit is written onto an area of the recording medium using the writing portion of the read/write head by locally changing its magnetic state. That magnetic state is later sensed by the MR sensor to read the data bit.

Two known types of MR sensors are a giant magnetoresistance (GMR) sensor and a tunnel magnetoresistance (TMR) sensor. The general technical basis, construction, and operation of the GMR sensor are described, for example, in U.S. Pat. No. 5,436,778. The general technical basis, construction, and operation of the TMR sensor are described, for example, in U.S. Pat. No. 5,729,410. The disclosures of both patents are incorporated by reference in their entireties. These patents also describe the read/write heads and the magnetic storage systems.

In one type of MR sensor structure, typified by the exchange tab GMR sensor and the in-stack bias TMR sensor, the sensor structure having a free layer that responds to external magnetic fields is overlaid, at least in part, with an upper antiferromagnetic layer. The upper antiferromagnetic layer exchange couples to the portion of the free layer that is overlaid. A relatively thick upper ferromagnetic "soft" layer is placed between the upper antiferromagnetic and the free layer to provide some magnetostatic bias to the sensor. However, as the upper ferromagnetic layer is made thicker, the exchange coupling between the upper antiferromagnetic layer and the overlaid portion of the free layer is reduced. The reduction in exchange coupling leads to magnetic instability due to domain formation in the free layer. The reduced exchange coupling also causes side-reading problems, so that the sensor detects magnetic fields laterally separated from the magnetic track that is in registry with the sensor structure.

There is a need to overcome these problems, without losing the beneficial aspects of the MR sensor structure. The present invention fulfills this need, and further provides related advantages.

SUMMARY OF THE INVENTION

The present approach provides a structure for the MR sensor that includes the upper ferromagnetic layer and the upper antiferromagnetic layer and achieves the benefits of their presence, but without the reduction in coupling strength and loss of stability associated with the existing designs as the upper ferromagnetic layer is made thicker. The upper ferromagnetic layer provides magnetostatic bias to the MR sensor, while the exchange coupling of the upper antiferromagnetic layer is retained.

In accordance with the invention, a magnetoresistance (MR) sensor structure comprises a magnetoresistance sensor having a sensor surface plane and a free layer (which responds to external magnetic fields), an upper antiferromagnetic layer overlying at least a portion of the free layer, and an upper ferromagnetic layer overlying and contacting at least a portion of the upper antiferromagnetic layer on a contact face lying parallel to the sensor surface plane. That is, the upper antiferromagnetic layer lies between the upper ferromagnetic layer and the free layer. Preferably, the upper antiferromagnetic layer is PtMn and the upper ferromagnetic layer is CoFe.

The magnetoresistance sensor may be a giant magnetoresistance (GMR) sensor. The upper antiferromagnetic layer and the upper ferromagnetic layer may overlie a first portion of the free layer that is less than all of the free layer, and the magnetoresistance sensor structure may further include a cap layer overlying a second portion of the free layer.

The magnetoresistance sensor may instead be a tunnel magnetoresistance (TMR) sensor. The upper antiferromagnetic layer and the upper ferromagnetic layer may overlie substantially all the free layer, and the magnetoresistance sensor structure may further include a cap layer overlying the upper ferromagnetic layer. A lead layer typically overlies the upper ferromagnetic layer.

Desirably, the magnetoresistance sensor includes a lower antiferromagnetic layer, and the free layer overlies the lower antiferromagnetic layer. Preferably in this embodiment, the lower antiferromagnetic layer and the upper ferromagnetic layer are made of the same material, most preferably PtMn.

In another embodiment, a magnetoresistance sensor structure comprises a magnetoresistance sensor having a sensor surface plane, a transverse direction lying in the sensor surface plane, and a longitudinal direction lying perpendicular to the transverse direction and in the sensor surface plane. The magnetoresistance sensor comprises a transverse biasing stack including a lower antiferromagnetic layer, and a free layer overlying the transverse biasing stack. A longitudinal biasing stack overlies the magnetoresistance sensor. The longitudinal biasing stack comprises an upper antiferromagnetic layer, and an upper ferromagnetic layer overlying and contacting at least a portion of the upper antiferromagnetic layer on a contact face lying parallel to the sensor surface plane. The upper antiferromagnetic layer lies between the upper ferromagnetic layer and the magnetoresistance sensor. The magnetoresistance sensor may be a giant magnetoresistance sensor or a tunnel magnetoresistance sensor. Compatible features described above for the other embodiments may be used with this embodiment as well.

The present approach positions the upper antiferromagnetic layer between the upper ferromagnetic layer and the free layer. The upper ferromagnetic layer provides magnetostatic bias to the sensor without a loss of exchange coupling strength between the antiferromagnetic layer and the free layer. With this arrangement of layers, both surfaces of the upper antiferromagnetic layer are employed to pin the adjacent layers, improving the efficiency of the structure. In the GMR sensor, for example, the bottom side of the upper antiferromagnetic layer pins the adjacent portion of the free layer, and the top side of the upper antiferromagnetic layer pins the upper ferromagnetic layer.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
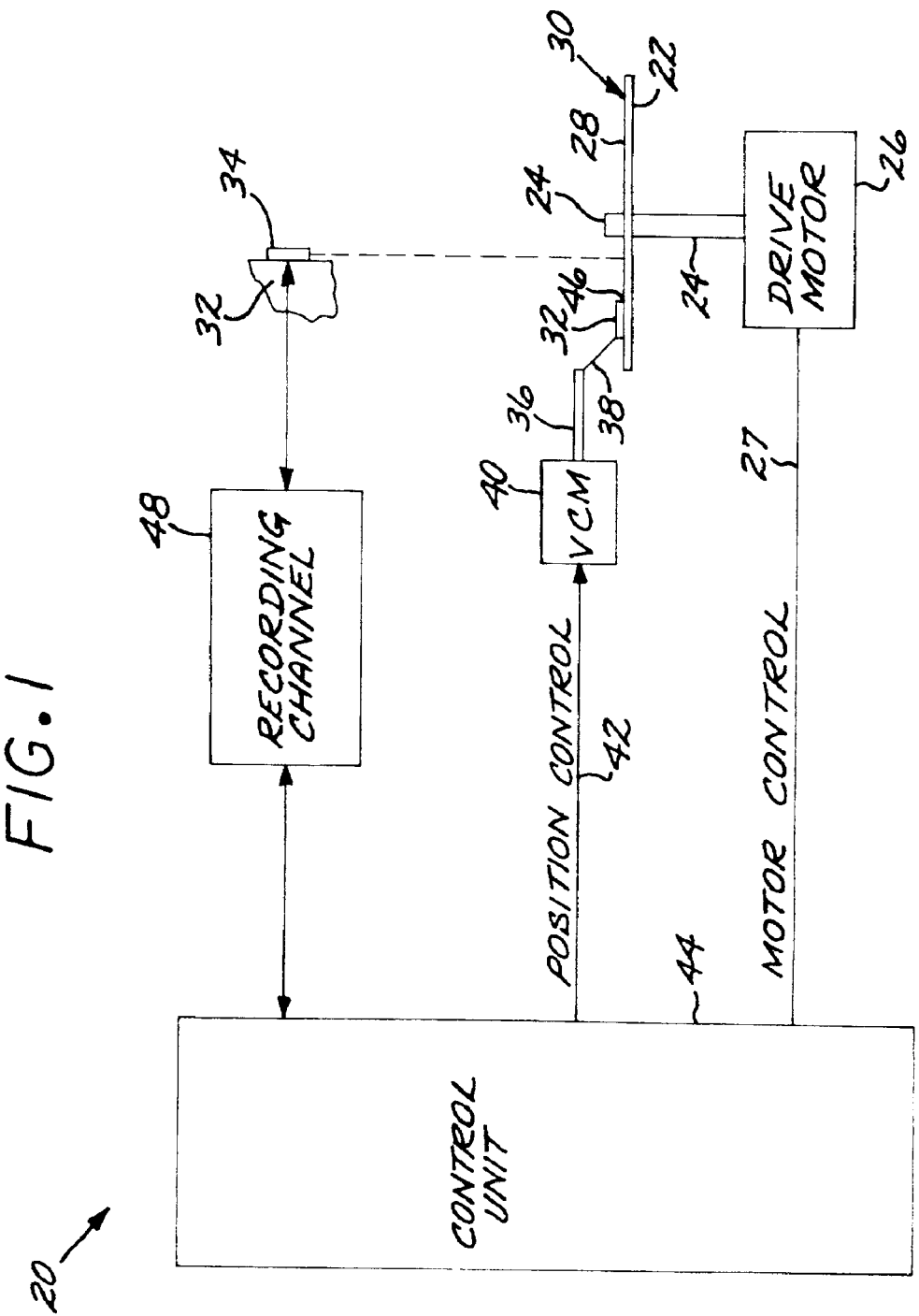
FIG. 1 is a schematic diagram of a magnetic disk data storage system.

FIG. 1 shows a data storage system, here depicted as a magnetic disk drive system 20, in which the present approach may be used. The magnetic disk drive system 20 includes a rotatable magnetic storage disk 22 that is supported on a spindle 24 and rotated by a disk drive motor 26 under motor control 27 of a control unit 44. A magnetic storage medium 28 is deposited on a surface 30 of the magnetic storage disk 22.

A slider 32 is positioned in facing relation to the magnetic storage disk 22. The slider 32 supports at least one read/write head 34 in facing relation to the magnetic storage medium 28 present on the facing surface of the magnetic storage disk 22. The slider 32 is mounted to an actuator arm 36 by a suspension 38. The actuator arm 36 and the slider 32 move radially inwardly and outwardly relative to the magnetic storage disk 22 so that the combined inward/outward motion of the slider 32 and the rotation of the magnetic storage disk 22 allow the read/write head 34 to be placed into facing relation to any region over the entire area of the magnetic storage medium 28. The actuator arm 36 is driven by an actuator 40 (depicted as a voice coil motor or VCM) under the radial position control 42 of the control unit 44.

The suspension 38 generates a slight spring force which biases the slider 32 toward the surface 30 of the magnetic storage disk 22. During sensor operation the magnetic storage disk 22 turns, and an air bearing is created between the downwardly facing surface of the slider 32, termed the air bearing surface 46 or ABS, and the upwardly facing surface 30 of the magnetic storage disk 22. (Only the downwardly oriented slider is illustrated, but there may also or instead be an upwardly oriented slider facing the bottom side of the magnetic storage disk.) The air bearing counterbalances the slight spring force of the suspension 38 and supports the slider 32 a small distance above the surface 30 with a small, substantially constant separation.

The read/write head 34 writes data onto the magnetic storage medium 28 by altering magnetic states in the magnetic storage medium, and also reads data from the magnetic storage medium 28 by sensing the magnetic states in the magnetic storage medium 28. The writing and reading commands, as well as the data to be written or read, are transmitted between the control unit 44 and the read/write head 34 over a recording channel 48, which provides the external interconnection to the sensor structure of the read portion of the read/write head 34. The present approach is concerned with the magnetoresistance (MR) sensor that is part of the read/write head 34.

The preceding discussion is a simplified description of the data storage system in the form of the magnetic disk drive system 20, to set the environment in which the present invention is used. The present invention is also applicable to other types of magnetic data storage systems such as magnetic tape drives and their read/write heads.

Figure 2:
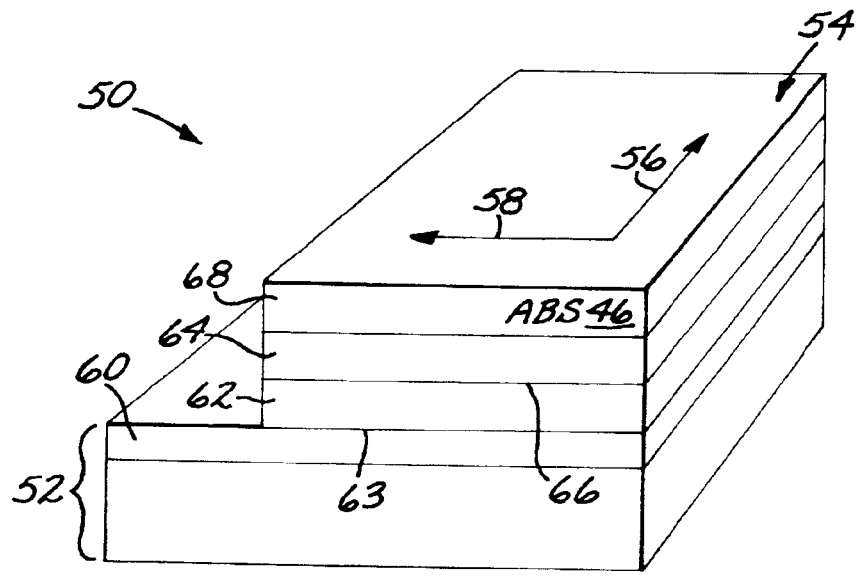
FIG. 2 is a schematic perspective view of the magnetoresistance sensor structure.

FIG. 2 shows a portion of a magnetoresistance (MR) sensor structure 50 included in the read/write head 34 of the magnetic disk drive system 20. The MR sensor structure 50 includes a magnetoresistance sensor 52. The MR sensor structure 50 is made of a series of layers or films that are very thin in relation to their lateral extent. (The figures herein are not drawn to scale.) To establish a frame of reference, the MR sensor structure 50 may be described as having a sensor surface plane 54, a transverse direction 56 lying in the sensor surface plane 54 and perpendicular to and away from the ABS 46, and a longitudinal direction 58 lying in the sensor surface plane 54 and perpendicular to the transverse direction 56. When the MR sensor 52 is assembled into the read/write head 34, the transverse direction 56 is perpendicular to the air bearing surface (ABS) 46 and thence to the surface 30 of the magnetic storage disk 22.

The magnetoresistance sensor 52 may be of any operable type, and two types of particular interest will be discussed subsequently. The magnetoresistance sensor 52 in each case has a free layer 60 that lies parallel to the sensor surface plane 54. At least a portion of the free layer 60 is free to respond to external magnetic fields.

An upper antiferromagnetic layer 62 overlies at least a portion of the free layer 60 and contacts that portion of the free layer 60 on a first contact face 63. The upper antiferromagnetic layer 62 lies parallel to the sensor surface plane 54. The upper antiferromagnetic layer 62 is preferably PtMn, but it may be of any operable antiferromagnetic material.

An upper ferromagnetic layer 64 lies parallel to the sensor surface plane 54. The upper ferromagnetic layer 64 overlies and contacts at least a portion of the upper antiferromagnetic layer 62 on a second contact face 66 lying parallel to the sensor surface plane 54. The upper antiferromagnetic layer 62 lies between the upper ferromagnetic layer 64 and the free layer 60. The upper ferromagnetic layer 64 may be any ferromagnetic material, but is preferably CoFe.

With this arrangement, the upper antiferromagnetic layer 62 exchange couples to and pins the contacted portion of the neighboring ferromagnetic free layer 60 through the first contact face 63 and also exchange couples to and pins the contacted portion of the upper ferromagnetic layer 64 through the second contact face 66. Thus, both faces of the upper antiferromagnetic layer 62 are utilized for pinning. In the conventional approach, by contrast, only the lower face of the upper antiferromagnetic layer, which contacts the adjacent ferromagnetic layer, is utilized in pinning; the upper face is adjacent to the cap layer, where it has no pinning function.

An optional cap layer 68 lies parallel to the sensor surface plane 54. The cap layer 68 overlies the upper ferromagnetic layer 64 in some embodiments and not others. The cap layer 68 may be any operable material, but is preferably tantalum.

Figure 3:
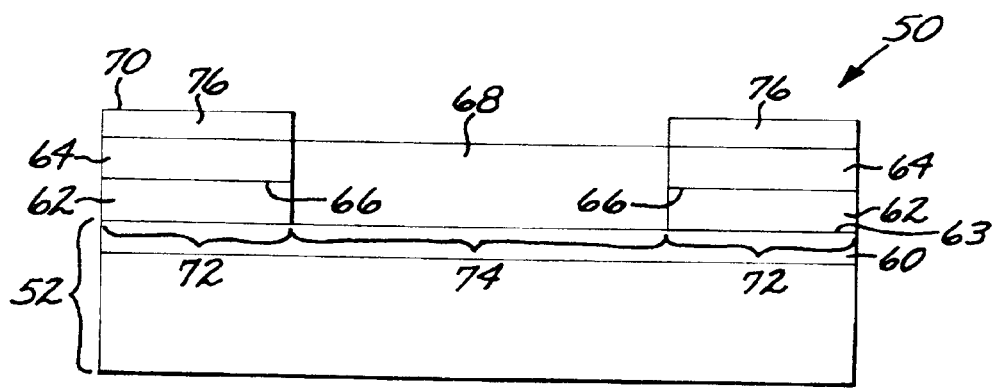
FIG. 3 is a schematic elevational view of the giant magnetoresistance sensor structure.
Figure 4:
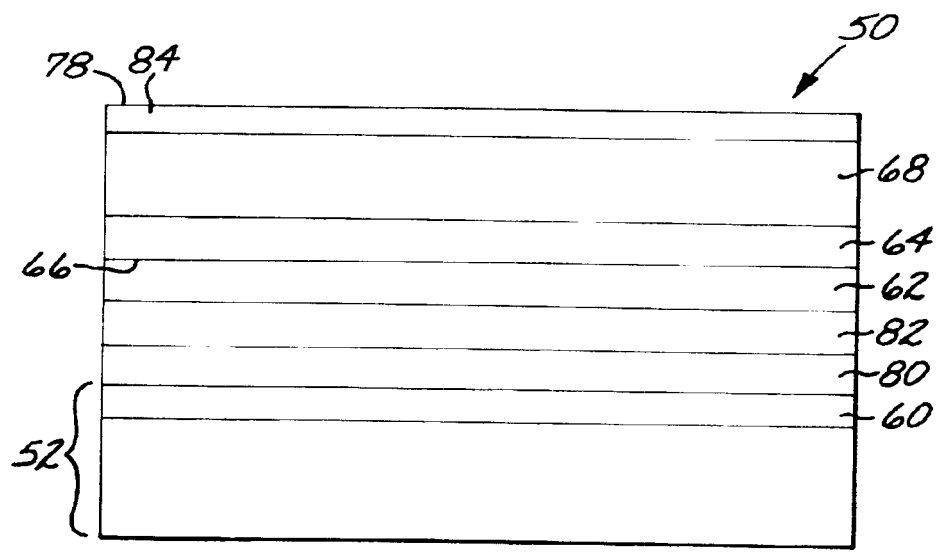
FIG. 4 is a schematic elevational view of the tunnel magnetoresistance sensor structure.

The MR sensor structure 50, shown generally in FIG. 2, may be implemented as a giant magnetoresistance (GMR) sensor structure 70 illustrated in FIG. 3 or a tunnel magnetoresistance (TMR) sensor structure 78 illustrated in FIG. 4. In FIGS. 3–4, elements previously discussed are assigned the same reference numerals, and the descriptions are incorporated herein.

Referring to FIG. 3, the GMR sensor structure 70 has the layers 62 and 64 defined as discrete exchange tabs 72 upon the free layer 60, leaving a central portion 74 without the overlying layers 62 and 64. The cap layer 68 overlies the central portion 74 but not the exchange tabs 72. Instead, external contacts 76 are deposited upon the exchange tabs 72.

In the preferred form of the GMR sensor structure 70, the upper antiferromagnetic layer 62 is PtMn about 150 Angstroms thick; the upper ferromagnetic layer 64 is CoFe about 30 Angstroms thick; the external lead 76 is rhodium about 400 Angstroms thick; and the cap layer 68 is tantalum about 40 Angstroms thick.

Referring to FIG. 4, the TMR sensor structure 78 has the layers 62 and 64 stacked in the manner described previously, with the cap layer 68 overlying the upper ferromagnetic layer 64 and an external contact 84, made of a high conductivity metal such as tantalum, rhodium, or ruthenium, overlying the cap layer 68. Additionally a decoupling layer 80 overlies and contacts the free layer 60, and a ferromagnetic layer 82 overlies and contacts the decoupling layer 80. The decoupling layer 80 and the ferromagnetic layer 82 thus lie between the free layer 60 and the upper antiferromagnetic layer 62.

In the preferred form of the TMR sensor structure, the decoupling layer 80 is copper about 20 Angstroms thick; the ferromagnetic layer 82 is CoFe about 30 Angstroms thick; the upper antiferromagnetic layer 62 is PtMn about 150 Angstroms thick; the upper ferromagnetic layer 64 is CoFe about 30 Angstroms thick; and the cap layer 68 is tantalum about 40 Angstroms thick.

Figure 5:
FIG. 5 is a schematic elevational view of a representative magnetoresistance sensor.

FIG. 5 depicts a preferred form of the MR sensor 52 that is used for the GMR sensor structure 70. The materials of construction and the indicated thicknesses of the layers are preferred, but other operable materials and thicknesses may be used. Starting from the bottom in FIG. 5, a substrate 90 is preferably aluminum oxide ($Al_2O_3$). Deposited upon and contacting the substrate is a stack seed layer 92. The stack seed layer 92 has two sublayers: a NiFeCr sublayer 96 about 25 Angstroms thick deposited upon and contacting the substrate 90, and a NiFe sublayer 98 about 8 Angstroms thick deposited upon and contacting the NiFeCr sublayer 96. The TMR sensor structure is similar, except that the substrate 90 is preferably a high conductivity metal such as tantalum, ruthenium, or rhodium.

A transverse pinning layer 100, preferably PtMn about 150 Angstroms thick, is deposited upon and contacts the stack seed layer 92. A transverse pinned layer structure 102 is deposited upon and contacts the Pt—Mn transverse pinning layer 100. The transverse pinned layer structure 102 includes three sublayers, a Co—Fe sublayer 104 about 16 Angstroms thick deposited upon and contacting the transverse pinning layer 100, a Ru sublayer 106 about 8 Angstroms thick deposited upon and contacting the Co—Fe sublayer 104, and a Co—Fe sublayer 108 about 19 Angstroms thick deposited upon and contacting the Ru sublayer 106.

A layer 110 overlies and contacts the transverse pinned layer structure 102. The nature of the layer 110 is different for the GMR sensor structure and the TMR sensor structure. In the case of the GMR sensor structure, the layer 110 is a $CuO_X$ spacer layer about 20 Angstroms thick. In the case of the TMR sensor structure, the layer 110 is about 7 Angstroms thick and made of a tunnel barrier layer material such as an $AlO_X$, MgO, or AlN.

The free layer 60 is deposited upon and contacts the spacer layer 110. In the illustrated form, the free layer 60 has two sublayers, a CoFe sublayer 112 about 15 Angstroms thick deposited upon and contacting the layer 110, and a NiFe sublayer 114 about 15 Angstroms thick deposited upon and contacting the Co—Fe sublayer 112.

The layered structure overlying this structure of FIG. 5 is that described in relation to FIGS. 2–4. Any of the structures of FIGS. 2–4 may be arranged to define bottom-type GMRs or top-type GMRs, or bottom-type TMRs or top-type TMRs.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A magnetoresistance sensor structure comprising:
    a magnetoresistance sensor having a sensor surface plane and comprising a free layer;
    an upper antiferromagnetic layer overlying at least a portion of the free layer; and
    an upper ferromagnetic layer overlying and contacting at least a portion of the upper antiferromagnetic layer on a contact face lying parallel to the sensor surface plane, so that the upper antiferromagnetic layer lies between the upper ferromagnetic layer and the free layer.

2. The magnetoresistance sensor structure of claim 1, wherein the upper antiferromagnetic layer is PtMn and the upper ferromagnetic layer is CoFe.

3. The magnetoresistance sensor structure of claim 1, wherein the magnetoresistance sensor is a giant magnetoresistance sensor.

4. The magnetoresistance sensor structure of claim 1, wherein the upper antiferromagnetic layer and the upper ferromagnetic layer overlie a first portion of the free layer that is less than all of the free layer, and further including a cap layer overlying a second portion of the free layer.

5. The magnetoresistance sensor structure of claim 1, wherein the magnetoresistance sensor is a tunnel magnetoresistance sensor.

6. A magnetoresistance sensor structure comprising:
    a magnetoresistance sensor having a sensor surface plane and comprising a free layer;
    an upper antiferromagnetic layer overlying substantially all the free layer;
    an upper ferromagnetic layer overlying substantially all the free layer and contacting the upper antiferromagnetic layer on a contact face lying parallel to the sensor surface plane, so that the upper antiferromagnetic layer lies between the upper ferromagnetic layer and the free layer; and
    a cap layer overlying the upper ferromagnetic layer.

7. A magnetoresistance sensor structure comprising:
    a magnetoresistance sensor having a sensor surface plane and comprising:
        a lower antiferromagnetic layer, and
        a free layer overlying the lower antiferromagnetic layer;
    an upper antiferromagnetic layer overlying at least a portion of the free layer; and
    an upper ferromagnetic layer overlying and contacting at least a portion of the upper antiferromagnetic on a contact face lying parallel to the sensor surface plane, so that the upper antiferromagnetic layer lies between the upper ferromagnetic layer and the free layer.

8. The magnetoresistance sensor structure of claim 7, wherein the lower antiferromagnetic layer and the upper antiferromagnetic layer are made of the same material.

9. The magnetoresistance sensor structure of claim 7, wherein the lower antiferromagnetic layer and the upper antiferromagnetic layer are both PtMn.

10. The magnetoresistance sensor structure of claim 7, wherein the upper ferromagnetic layer is CoFe.

11. The magnetoresistance sensor structure of claim 7, wherein the magnetoresistance sensor is a giant magnetoresistance sensor.

12. The magnetoresistance sensor structure of claim 7, wherein the upper antiferromagnetic layer and the upper ferromagnetic layer overlie a first portion of the free layer that is less than all of the free layer.

13. A magnetoresistance sensor structure comprising:
   a magnetoresistance sensor having a sensor surface plane and comprising:
      a lower antiferromagnetic layer, and
      a free layer overlying the lower antiferromagnetic layer;
      an upper antiferromagnetic layer overlying a first portion of the free layer that is less than all of the free layer;
      an upper ferromagnetic layer overlying a first portion of the free layer that is less than all of the free layer and contacting the upper antiferromagnetic layer on a contact face lying parallel to the sensor surface plane, so that the upper antiferromagnetic layer lies between the upper ferromagnetic layer and the free layer; and
      a cap layer overlying a second portion of the free layer.

14. The magnetoresistance sensor structure of claim 7, wherein the upper antiferromagnetic layer and the upper ferromagnetic layer overlie a first portion of the free layer that is less than all of the free layer, and further including
   a lead layer overlying the upper ferromagnetic layer.

15. The magnetoresistance sensor structure of claim 7, wherein the upper antiferromagnetic layer and the upper ferromagnetic layer overlie a first portion of the free layer that is less than all of the free layer, and further including
   a lead layer overlying the upper ferromagnetic layer; and
   a cap layer overlying a second portion of the free layer.

16. The magnetoresistance sensor structure of claim 7, wherein the magnetoresistance sensor is a tunnel magnetoresistance sensor.

17. A magnetoresistance sensor structure comprising:
   a magnetoresistance sensor having a sensor surface plane and comprising:
      a lower antiferromagnetic layer, and
      a free layer overlying the lower antiferromagnetic layer;
      an upper antiferromagnetic layer overlying substantially all the free layer;
      an upper ferromagnetic layer overlying substantially all the free layer and contacting the upper antiferromagnetic layer on a contact face lying parallel to the sensor surface plane, so that the upper antiferromagnetic layer lies between the upper ferromagnetic layer and the free layer; and
      a cap layer overlying the upper ferromagnetic layer.

18. A magnetoresistance sensor structure comprising:
   a magnetoresistance sensor having a sensor surface plane, a transverse direction lying in the sensor surface plane, and a longitudinal direction lying perpendicular to the transverse direction and in the sensor surface plane, the magnetoresistance sensor comprising:
      a transverse biasing stack including a lower antiferromagnetic layer, and
      a free layer overlying the transverse biasing stack; and
      a longitudinal biasing stack overlying the magnetoresistance sensor, the longitudinal biasing stack comprising:
         an upper antiferromagnetic layer, and
         an upper ferromagnetic layer overlying and contacting at least a portion of the upper antiferromagnetic layer on a contact face lying parallel to the sensor surface plane, so that the upper antiferromagnetic layer lies between the upper ferromagnetic layer and the magnetoresistance sensor.

19. The magnetoresistance sensor structure of claim 18, wherein the magnetoresistance sensor is a giant magnetoresistance sensor.

20. The magnetoresistance sensor structure of claim 18, wherein the magnetoresistance sensor is a tunnel magnetoresistance sensor.

21. A magnetoresistance sensor structure comprising:
   a magnetoresistance sensor having a sensor surface plane and comprising:
      a free layer;
      an upper antiferromagnetic layer overlying at least a portion of the free layer in a plane parallel to the sensor surface plane; and
      an upper ferromagnetic layer overlying and contacting at least a portion of the upper antiferromagnetic on a contact face lying parallel to the sensor surface plane, so that the upper antiferromagnetic layer lies between the upper ferromagnetic layer and the free layer in a plane parallel to the sensor surface plane.

22. A magnetoresistance sensor structure comprising:
   a magnetoresistance sensor having a sensor surface plane and comprising:
      a lower antiferromagnetic layer;
      a free layer overlying the lower antiferromagnetic layer;
      an upper antiferromagnetic layer overlying at least a portion of the free layer in a plane parallel to the sensor surface plane; and
      an upper ferromagnetic layer overlying and contacting at least a portion of the upper antiferromagnetic on a contact face lying parallel to the sensor surface plane, so that the upper antiferromagnetic layer lies between the upper ferromagnetic layer and the free layer in a plane parallel to the surface plane.

23. A magnetoresistance sensor structure comprising:
   a magnetoresistance sensor having a sensor surface plane, a transverse direction lying in the sensor surface plane, and a longitudinal direction lying perpendicular to the transverse direction and in the sensor surface plane, the magnetoresistance sensor comprising:
      a transverse biasing stack including a lower antiferromagnetic layer;
      a free layer overlying the transverse biasing stack; and
      a longitudinal biasing stack overlying the magnetoresistance sensor, the longitudinal biasing stack comprising:
         an upper antiferromagnetic layer; and
         an upper ferromagnetic layer overlying and contacting at least a portion of the upper antiferromagnetic layer on a contact face lying parallel to the sensor surface plane, so that the upper antiferromagnetic layer lies between the upper ferromagnetic layer and the magnetoresistance sensor in a plane parallel to the sensor surface plane.

* * * * *

UNITED STATES PATENT AND TRADEMARK OFFICE
CERTIFICATE OF CORRECTION

PATENT NO. : 6,961,225 B2
DATED : November 1, 2005
INVENTOR(S) : Hardayal Singh Gill It is certified that error appears in the above-identified patent and that said Letters Patent is hereby corrected as shown below:

<u>Column 8,</u>
Lines 24 and 40, after "antiferromagnetic", insert -- layer --.

Signed and Sealed this

Twenty-first Day of March, 2006

JON W. DUDAS
*Director of the United States Patent and Trademark Office*